United States Patent [19]

Masuda et al.

[11] Patent Number: 4,665,381
[45] Date of Patent: May 12, 1987

[54] DIGITAL-TO-ANALOG CONVERTER

[75] Inventors: Eiji Masuda, Kawasaki; Yasuhiko Fujita, Tokyo, both of Japan

[73] Assignee: Kabushiki Kaisha Toshiba, Kawasaki, Japan

[21] Appl. No.: 601,247

[22] Filed: Apr. 17, 1984

[30] Foreign Application Priority Data

Apr. 18, 1983 [JP] Japan .................................. 58-68082

[51] Int. Cl.⁴ ........................................... H03K 13/02
[52] U.S. Cl. ...................... 340/347 DA; 340/347 CC; 340/347 M
[58] Field of Search .... 340/347 DA, 347 M, 347 CC; 323/353, 354

[56] References Cited

U.S. PATENT DOCUMENTS 3,705,359 12/1972 Kappes ..................... 340/347 AD X
3,812,478  5/1974 Tomisawa et al. ............. 307/529 X
4,160,244  7/1979 Solomon et al. ..................... 340/347
4,338,591  7/1982 Tuthill .................................. 340/347
4,363,024 12/1982 Brokaw ........................ 340/347 DA
4,491,825  1/1985 Tuthill .......................... 340/347 DA

OTHER PUBLICATIONS

The Digital Logic Handbook, "32-Position Decoding", 1966-1967 Edition, pp. 247-249.

Primary Examiner—William M. Shoop, Jr.
Assistant Examiner—Sharon D. Logan
Attorney, Agent, or Firm—Finnegan, Henderson, Farabow, Garrett & Dunner

[57] ABSTRACT

In a D/A converter, a reference voltage is divided into a plurality of divided voltages by a plurality of resistors connected in series. The divided voltages are respectively selected by switches which are turned on according to the contents of a digital input. With the use of an expanding bit or bits, a plurality of the switches are simultaneously turned on.

4 Claims, 6 Drawing Figures

DIGITAL-TO-ANALOG CONVERTER

BACKGROUND OF THE INVENTION

The present invention relates to a digital-to-analog converter circuit assembled into a successive approximation type analog-to-digital converter fabricated into a semiconductor integrated circuit.

This type of analog-to-digital converter requires a digitial-to-analog converter for generating analog signals are references, according to a digital signal. An example of this type of D/A converter is shown in FIG. 1. This circuit employs a string resistor network which is suitable for fabricating the circuit into an IC chip. In FIG. 1, a reference voltage Vref produced by a reference voltage source V is applied across a string of resistors r1 to rn connected in series. The divided voltages divided by the resistors r1 to rn are respectively connected to an analog output terminal Aout through switches S0 to Sn. One of the switches S0 to Sn is selected according to a digital input Din applied through a switch select logic circuit SEL. The number of the switches S0 to Sn is selected corresponding to the number of bits of the digital input Din. For this reason, if the number of bits of the digital input increases, the number of switches is increased, resulting in increase of the circuit size, and hence enlargement of the chip size. For example, for the digital input Din of 8 bits, 256 switches are required. For the digital input of 9 bits, 512 switches are required. 1024 switches are required for the digital input of 10 bits. Thus, as the number of bits of the digital input increases, the number of switches required greatly increases.

Generally, a high accuracy D/A conversion requires an increased number of bits of the digital input. This provides many problems. The increased number of switches increases the chip size. The increase of the chip size increases the cost to manufacture. The increased number of switches increases a stray capacitance associated with the switches. The increased stray capacitance slows the response of the analog output when the digital input Din changes, decreasing the operating speed of the device.

SUMMARY OF THE INVENTION

Accordingly, an object of the present invention is to provide an analog-to-digital converter operable with high accuracy and at a high speed, which is fabricated with a small chip size and thus suitable for IC fabrication.

According to the invention, there is provided a digital-to-analog circuit comprising a voltage dividing circuit including a plurality of resistors connected in series; a plurality of switches for receiving the divided voltages from said voltage dividing circuit and providing them as corresponding analog signals; a switch select logic circuit for producing a switch select signal for selecting one of the plurality of said switches according to the contents of a digital input; and a logic control circuit for turning on one or more switches in response to a switch select signal of said switch select logic circuit and a signal of an expanding bit of said digital input.

DETAILED DESCRIPTION OF THE PREFERRED EMBODIMENTS

Figure 1:
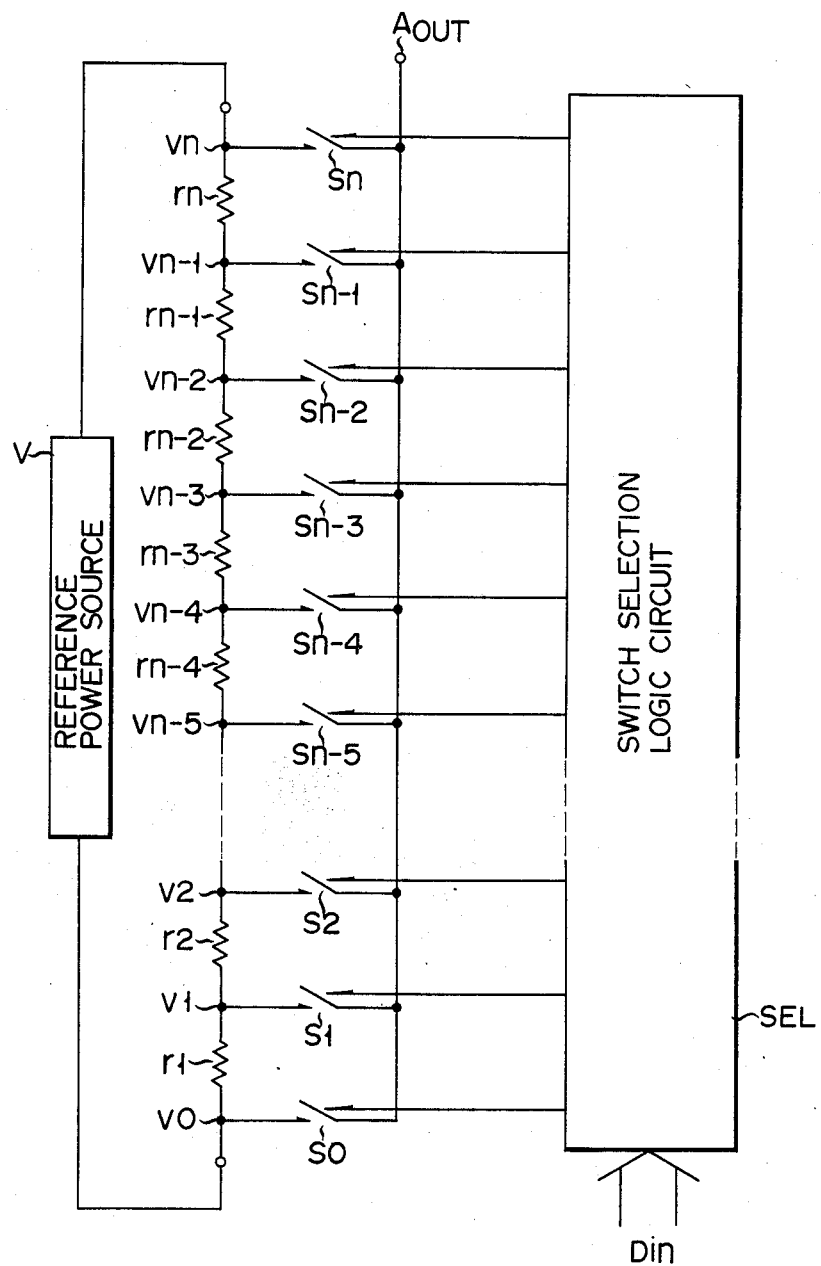
FIG. 1 is a schematic diagram of a D/A converter of prior art.
Figure 2:
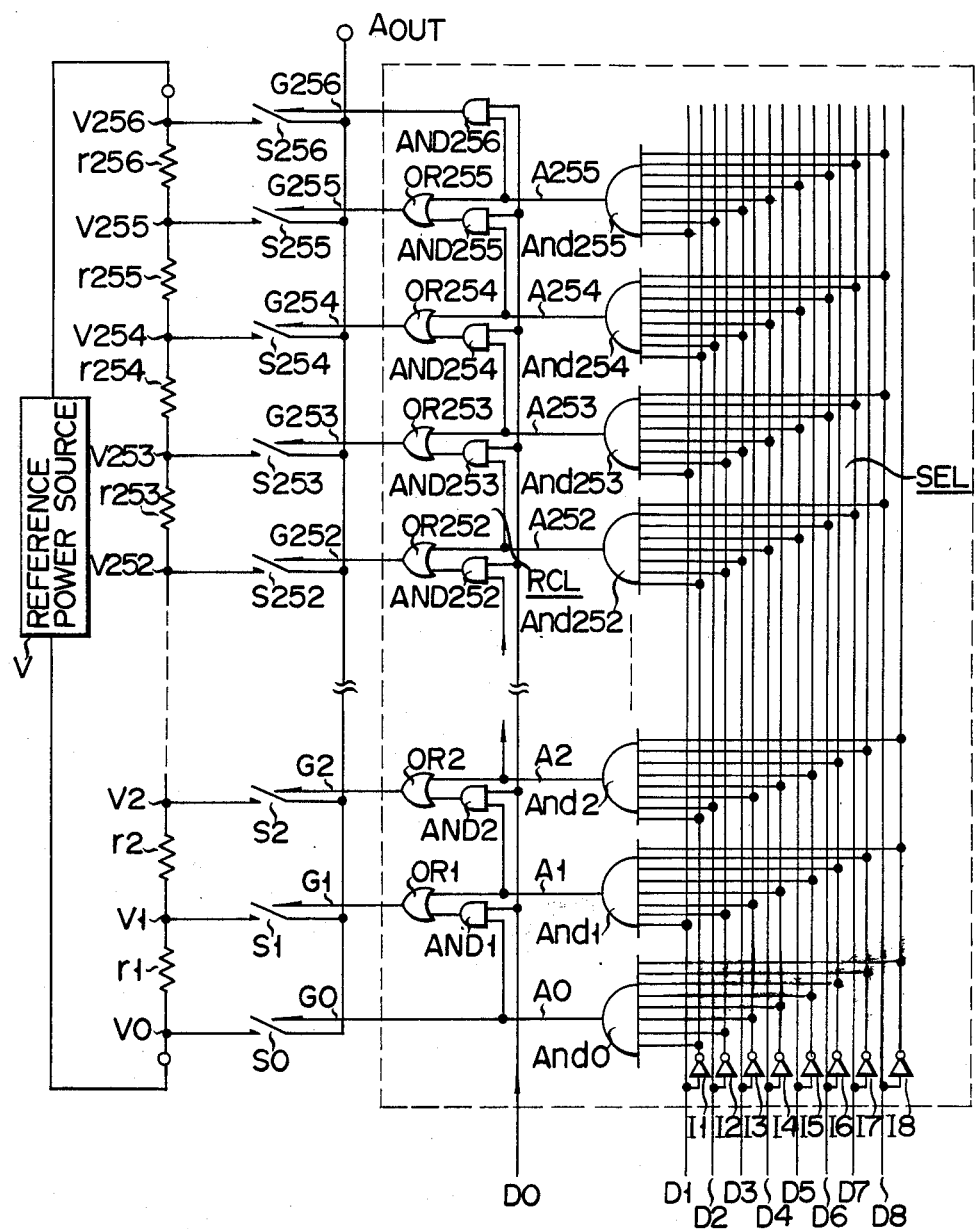
FIG. 2 is a schematic diagram of a D/A converter which is an embodiment according to the present invention.

A first embodiment of a D/A converter according to the present invention will be given referring to FIGS. 2 and 3. A circuit of this a D/A converter is arranged so as to treat the input data consisting of digital data of 8 bits D1 to D8 and one expanding bit D0. The D/A converter comprises a reference power source Vref, a string voltage dividing section including 256 ($=2^8$) resistors r1 to r256, connected in series, a switch section including switches S0 to S256, a logic control section RCL, and a switch select logic section SEL. The reference voltage Vref of the reference power source V is applied across the voltage dividing section which in turn produces divided voltages V0 to V256. Those divided voltages are derived from an output terminal Aout of the D/A converter, through a group of switches S0 to S256.

The switch select logic section SEL produces switch control signals G0 to G256 for controlling the switches S0 to S256. The switch control signals G0 to G256 are formed using the digital inputs D1 to D8 of those D0 to D8 bits, by the switch select logic section SEL. Functionally, the switch select logic section SEL serves as a decoder to render active one of the switch control signals G0 to G256 according to the contents of the digital input signals D1 to D8. Structurally, the switch select logic section SEL comprises AND gates with eight inputs And0 to And255 corresponding to S0 to S255.

The logic control section RCL comprises AND gates with two inputs AND1 to AND256, and OR gates with two inputs OR1 to OR256. The digital inputs D1 to D8 and the inverted outputs D1 to D8 from inverters I1 to I8 coupled at the inputs with the digital inputs D1 to D8, are applied to the AND gates And0 to And256, as shown. The input D0 as the least significant bit is applied to first inputs of the AND gates AND1 to AND256. The switch select signals A0 to A255 are applied from the AND gates And0 to And255 to the second inputs of the AND gates AND1 to AND256, respectively. The outputs A0 to A255 of the AND gates And0 to And255 and the outputs of the AND gates AND1 to AND255 are OR tied by the OR gates OR1 to OR255, respectively. The outputs of the OR gates OR1 to OR255 are directly applied to the switches S1 to S255, respectively. The remaining switches S0 and S256 are connected to the AND gate And0 and the AND gate AND256, respectively.

In the D/A converter thus arranged, the logic control circuit RCL drives one of the switches S0 to S256 according to the contents of the 8-bit data D1 to D8. Then, it selects one of the divided voltages of the string voltage dividing section. The control circuit RCL further selects an additional switch according to the contents of the LSB input data D0. Specifically, when the LSB D0 is in active level, selected is the switch by one bit higher in order than the selected switch. With this additional higher order switch, the switch select logic section SEL selects a divided voltage one bit higher in order than and adjacent to the selected one. When the LSB D0 is in nonactive level, this higher order switch is not actuated and then the corresponding divided voltage is not selected. In this way, the switch select logic circuit SEL selects one or two switches of those S0 to S256 according to the contents of the LSB D0.

Figure 3:
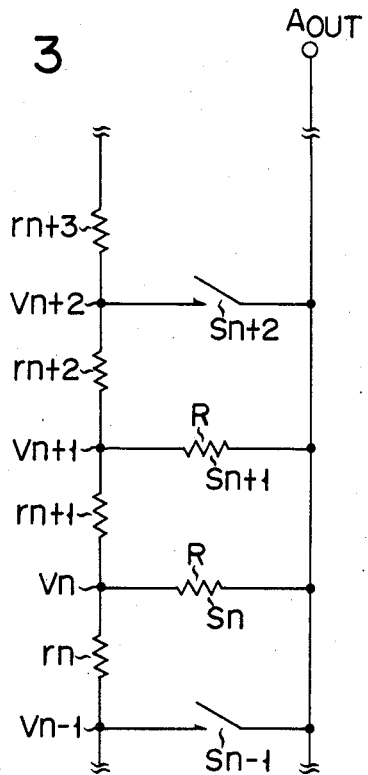
FIG. 3 is a schematic diagram of a part of the D/A converter of FIG. 2.

This is diagrammatically illustrated in FIG. 3. As shown, if the switch control signal Gn from the logic control section RCL is active the switch Sn is turned on and the divided voltage Vn is selected and passed to the output terminal Aout via the switch Sn. At this time, if the LSB D0 is nonactive, the remaining switch control signals are all nonactive. The corresponding switches are all in OFF state and the corresponding divided voltages are also not produced. Conversely, if the LSB D0 is active, the switch control signal Gn+1 is active. Then, the switch Sn+1, which is one bit higher in order than the switch Sn, is turned on. The divided voltage adjacent to and one bit higher in order than the divided voltage Vn is also selected. In this case, the divided voltages Vn and Vn+1 are simultaneously selected.

In designing this D/A converter thus arranged, it is desirable that ON resistances of the switches S0 to S256 are all substantially equal to one another. The equivalent circuit shown in FIG. 3 is depicted on the assumption that the ON resistances are substantially equal to each other.

The output voltage Vout at the analog output terminal Aout when the two switches Sn and Sn+1 are simultaneously turned on, as shown in FIG. 3, is given $$Vout = Vn + \tfrac{1}{2}v \qquad (1)$$

The above equation is based on the assumption that resistance of the voltage dividing resistors r1 to r256 is much smaller than those of the ON resistance of the switches S0 to S256. Further, in the above equation, v is a difference between the adjacent voltages of those V0 to V256. If the ON resistances of the switches S0 to S256 are substantially equal to one another, and the resistance of the voltage dividing resistors r1 to r256 is satisfactorily smaller than the ON resistance of those switches, the difference voltage Vd is $$Vd = \frac{1}{2^N - 1}$$

(maximum divided voltage − base divided voltage)

where N is the number of bits of the digital input. Therefore, the difference volage Vd in this embodiment is $$Vd = \frac{1}{2^9 - 1}(V256 - V0)$$

As seen from the foregoing description, a circuit arrangement of the above-mentioned embodiment, structured with a string resistor section of 8-bit resolution and switches associated therewith, has an additional bit, i.e. an expanding bit. With the use of the expanding bit, this embodiment has an improved ability of 9-bit resolution in the D/A conversion. Nevertheless, the size of the circuit in the embodiment is increased very little and comparable with that of the D/A converter of 8-bit resolution. The circuit of the D/A converter is halved in size when compared with the conventional one. Further, the number of the switches remains equal to that of the 8-bit D/A converter. This implies that the stray capacitance is not increased and a high operation speed is secured. Thus, the circuit arrangement of this embodiment is suitable for IC fabrication.

Let us consider another case where the $\overline{ON}$ resistance of the switches S0 to S256 is satisfactorily larger than the resistance of the resistor r1 to r256. Generally, when this type of the D/A converter is fabricated into an IC chip, the resistance of the resistors r1 to r256 in the voltage dividing circuit is selected to be approximately 0.1 to 100 ohms. With such values selected, if those switches S0 to S256 are realized by MOSFETs, the above-mentioned condition is met, since the MOSFET with the normal size dimension has approximately 1 to 100 Kilo hms in ON resistance.

Figure 4:
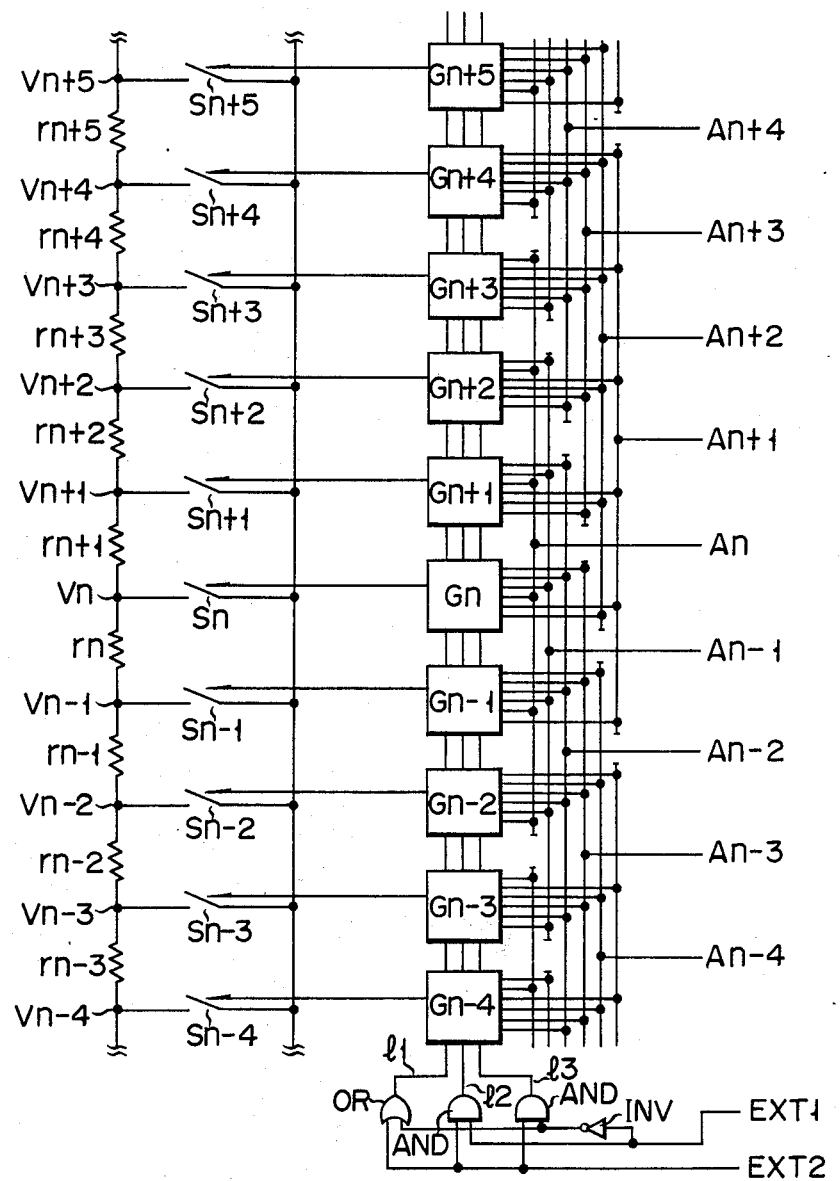
FIG. 4 is a schematic diagram of another embodiment of a D/A converter according to the present invention.

It should be understood that the present invention is not limited to the embodiment as mentioned above. For example, the above embodiment with 8 bits resolution is so arranged as to have 9 bits resolution using one expanding bit. However, a plurality of bits may be expanded for greater resolution. This is implemented in another embodiment shown in FIG. 4 which uses two expanding bits EXT1 and EXT2. A logic control circuit RCL contains control circuits Gn+5 to Gn−4 associated with switches Sn+5 to Sn−4. The circuit RCL selects one of the switches Sn+5 to Sn−4 according to the switch select signals An+4 to An−4 and the expanding bits EXT1 and EXT2. As shown, the expanding signals EXT1 and EXT2 enter a logic circuit containing an OR gate OR, and two AND gates AND and an inverter INV, as shown in FIG. 4, and select output lines l1 to l3, as shown in the following table.

TABLE

| EXT1 | EXT2 | l1 | l2 | l3 |
|------|------|----|----|----|
| 0 | 0 | 0 | 0 | 0 |
| 0 | 1 | 1 | 0 | 1 |
| 1 | 0 | 1 | 0 | 0 |
| 1 | 1 | 1 | 1 | 0 |

Figure 5:
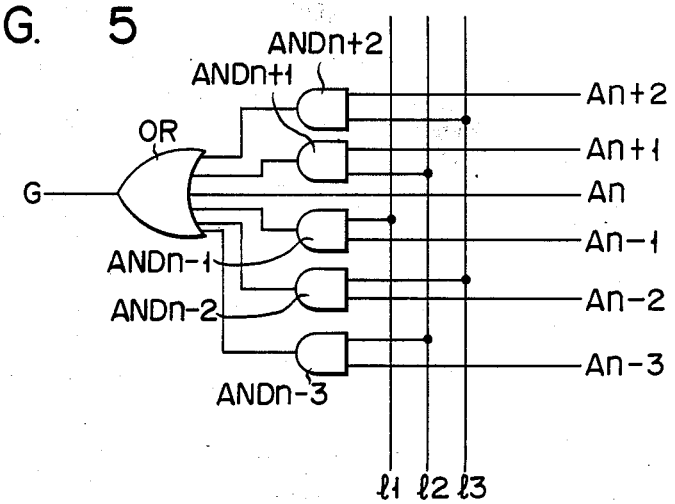
FIG. 5 is a functional diagram of a control section fabricated into the embodiment of FIG. 4.

The control circuit G, which receives the signals coming through the output lines l1 to l3 and the switch select signals A from the switch select logic circuit SEL, may be arranged as shown in FIG. 5, for example. In this case, the switch select logic circuit SEL (not shown in FIG. 4) may be substantially the same as that of FIG. 2. As shown, switch select signals An−3, An−2, An−1, An+1 and An+2 are respectively applied to the first inputs of AND gates ANDn−3, ANDn−2, ANDn−1, ANDn+1 and ANDn+2 of which the other inputs are coupled with the output lines l2, l3, l1, l2, l3, as shown. The outputs of those five AND gates are OR tied by an OR gate. Upon receipt of those signals, the OR gate produces a switch control signal G for transmission to the corresponding switch.

Figure 6:
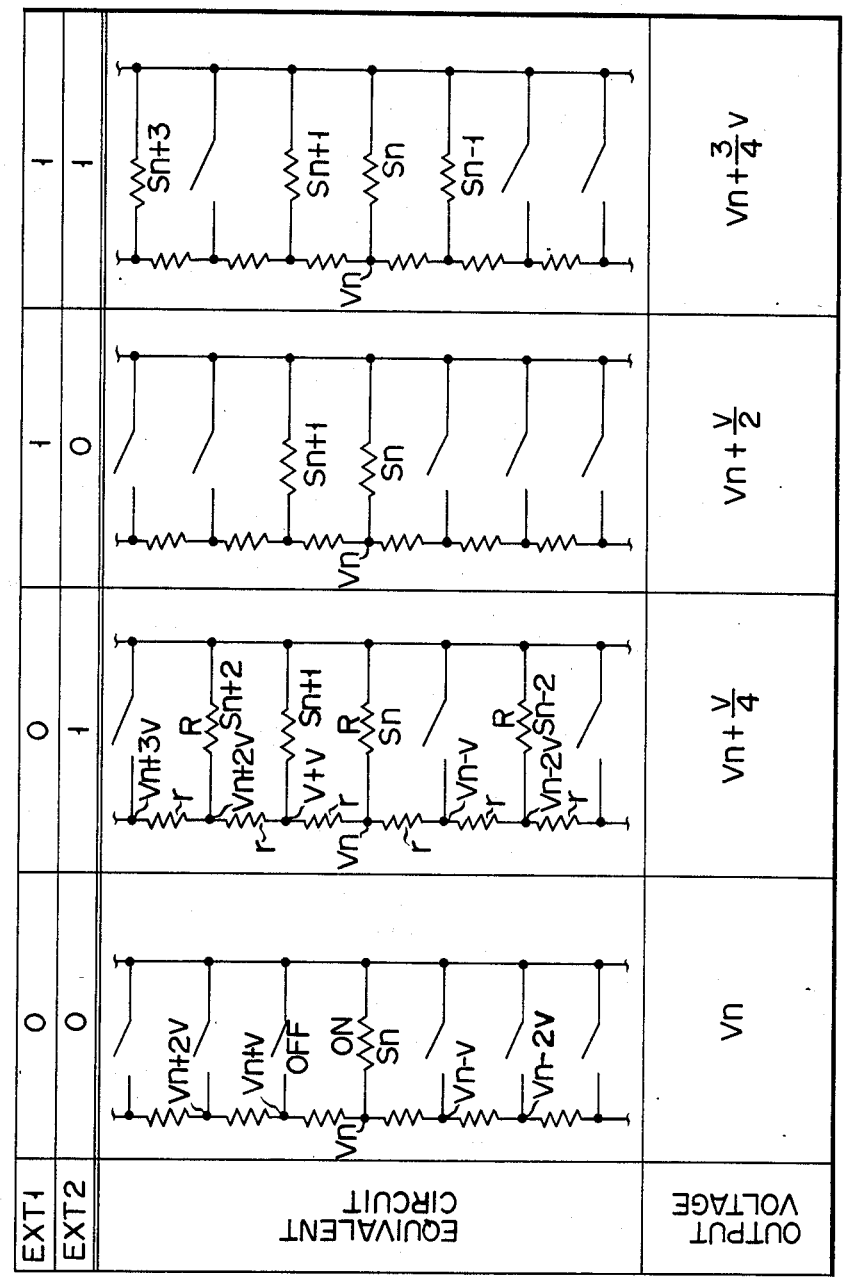
FIG. 6 is a table correspondingly illustrating expanding bits, equivalent circuits, and output voltages.

The contents of the expanding bits EXT1 and EXT2 and the corresponding equivalent circuits and output voltages are shown in FIG. 6. The table shows that when the expanding bits EXT1 and EXT2 are "0" and "0", respectively, only the switch Sn is turned on, and the output voltage Vn is produced. When the expanding bits EXT1 and EXT2 are "0" and "1", respectively, the corresponding switch Sn is turned on, and further the higher potential switches Sn+1 and Sn+2, and the lower potential switch Sn−2 are turned on. The voltage produced at this time is Vn+v/4. When these expanding bits are "1" and "0", the switches Sn and Sn+1 are turned on, and the output voltage Vn+v/2 is produced. Additionally, when those expanding bits are "1" and "1", the four switches Sn−1, Sn, Sn+1 and Sn+3 are turned on and the output voltage Vn+3/4v is produced.

Resistance r of the resistors r1 to r256 in the voltage dividing circuit is much smaller than the ON resistance of the switches S0 to S256. Therefore, each tap voltage of the switch turned on may be considered as a voltage source.

Why the voltage Vout takes the values shown in FIG. 6 will be given below. For example, EXT1=0, EXT2=1 (Vout=Vn+v/4). Under this condition, the ON switches are, Sn−2, Sn, Sn+1 and Sn+2. Accordingly, the tap voltages are Vn−2v, Vn, Vn+v, and Vn+2v. According to Kirchhoff's law, the total sum of the currents at the analog output Aout is zero and $$\frac{Vn + 2v - Vout}{R} + \frac{Vn + v - Vout}{R} + \frac{Vn - Vout}{R} + \frac{Vn - 2v - Vout}{R} = 0 \quad (2)$$

Rearranging this equation, we have

Output voltage Vout=Vn+v/4

As described above, according to the present invention, the circuit size is small for the number of bits of the digital input. This allows the use of a small chip area even for a high accuracy analog conversion. Further, the parasitic capacitance of the analog output terminals is increases very little, assuring a high speed operation.

What is claimed is:

1. A digital-analog converter, coupled to sources of high and low potential, for converting a digital input of having n bits into an analog output voltage, said n-bit digital input including a first group of higher order bits and a second group of lower order bits and said converter comprising:

an input terminal receiving said n-bit digital input;

an output terminal presenting said analog output voltage;

a first number of resistors serially connected between said sources of high and low potential such that junctions at which said resistors are connected have potential values determined by a ratio of resistance values of said resistors, said first number of said resistors being less than $2^{n-1}$;

a second number of switches each connected between a different one of said junctions of said resistors and said output terminal, said second number also being less than $2^{n-1}$; and decoder circuit means, connected to said input terminal and to said switches, for receiving said n-bit binary input and for rendering selected ones of said switches conductive according to said first group of bits, said decoder circuit means including first selection means, responsive to said second group of bits being in a specified state, for rendering conductive one of said second switches corresponding to said first group of bits when said second group of bits is in said specified state, and second selection means, responsive to said second group of bits, for rendering conductive said one switch corresponding to said first group of bits and at least one other of said switches corresponding to said first and second input bit groups when the second input bit group is not in said specified state.

2. A digital-analog converter according to claim 1 wherein each of said switches has an ON resistance greater than the resistance value of any of said resistors.

3. A digital-analog converter according to claim 1 wherein said first number and said second number are equal to $2^{n-1}$.

4. A digital-analog converter according to claim 1 wherein said first number and said second number are equal to $2^{n-2}$.

* * * * *